(12) United States Patent
Forbes et al.

(10) Patent No.: US 6,456,157 B1
(45) Date of Patent: *Sep. 24, 2002

(54) THRESHOLD VOLTAGE COMPENSATION CIRCUITS FOR LOW VOLTAGE AND LOW POWER CMOS INTEGRATED CIRCUITS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/626,214

(22) Filed: Jul. 26, 2000

Related U.S. Application Data

(63) Continuation of application No. 09/031,976, filed on Feb. 26, 1998, now Pat. No. 6,097,242.

(51) Int. Cl.[7] ............................................. G05F 3/01
(52) U.S. Cl. .................................................... 327/543
(58) Field of Search ................................. 327/534, 537, 327/543; 365/226

(56) References Cited

U.S. PATENT DOCUMENTS

| | | | |
|---|---|---|---|
| 3,657,575 A | * 4/1972 | Taniguchi et al. | 327/541 |
| 3,806,741 A | 4/1974 | Smith | 307/304 |
| 5,227,697 A | 7/1993 | Sakagami | 365/203 |
| 5,292,676 A | 3/1994 | Manning | 437/46 |
| 5,385,854 A | * 1/1995 | Batra et al. | 437/41 |
| 5,451,889 A | * 9/1995 | Heim et al. | 327/534 |
| 5,502,629 A | * 3/1996 | Ito et al. | 327/536 |
| 5,646,900 A | 7/1997 | Tsukude et al. | 365/205 |
| 5,789,967 A | * 8/1998 | Katoh | 327/534 |
| 5,818,084 A | 10/1998 | Williams et al. | 257/329 |
| 5,821,796 A | * 10/1998 | Yaklin et al. | 327/534 |
| 5,834,814 A | 11/1998 | Ito | 257/378 |
| 5,852,375 A | * 12/1998 | Byrne et al. | 327/108 |
| 5,883,544 A | 3/1999 | So et al. | 327/537 |
| 5,909,400 A | * 6/1999 | Bertin et al. | 365/187 |
| 5,909,618 A | 6/1999 | Forbes et al. | 438/242 |
| 5,914,511 A | 6/1999 | Noble et al. | 257/302 |
| 5,926,412 A | 7/1999 | Evans, Jr. et al. | 365/145 |
| 5,963,469 A | * 10/1999 | Forbes | 365/149 |
| 6,075,404 A | 6/2000 | Shindoh et al. | 327/537 |
| 6,252,452 B1 | 6/2001 | Hatori et al. | 327/544 |

OTHER PUBLICATIONS

Asai, S., et al., "Technology Challenges for Integration Near and Below 0.1 micrometer", *Proceedings of the IEEE, 85(4)*, Special Issue on Nanometer–Scale Science & Technology, 505–520, (Apr. 1997).

(List continued on next page.)

*Primary Examiner*—Terry D. Cunningham
(74) *Attorney, Agent, or Firm*—Schwegman, Lundberg, Woessner & Kluth, P.A.

(57) ABSTRACT

A compensation circuit for transistor threshold voltages in integrated circuits is described. The compensation circuit includes a transistor, current source, and gate reference voltage supply. The transistor is biased to provide a well bias voltage, or backgate voltage $V_{BG}$, which is coupled to transistors provided on a common integrated circuit. This compensation circuit eliminates the need for gate biasing capacitors, and provides flexibility in setting threshold voltages in low voltage circuits. The gate reference voltage and current source: are established to provide a desired backgate voltage $V_{BG}$. Compensation circuits are described for both n-channel and p-channel transistors. A memory device is described which includes compensation circuits for controlling threshold voltages of transistors provided therein.

28 Claims, 5 Drawing Sheets

OTHER PUBLICATIONS

Askin, H.O., et al., "Fet Device Parameters Compensation Circuit", *IBM Technical Disclosure Bulletin, 14*, 2088–2089, (Dec. 1971).

Blalock, T.N., et al., "A High–Speed Sensing Scheme for 1T Dynamic RAM's Utilizing the Clamped Bit–Line Sense Amplifier", *IEEE Journal of Solid–State Circuits, 27(4)*, pp. 618–624, (Apr. 1992).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

Burnett, D., et al., "Statistical Threshold–Voltage Variation and its Impact on Supply–Voltage Scaling", *Proceedings SPIE: Microelectronic Device and Multilevel Interconnection Technology, 2636*, 83–90, (1995).

Chen, M.J., et al., "Back–Gate Forward Bias Method for Low–Voltage CMOS Digital Cicuits", *IEEE Transcations on Electron Devices, 43*, 904–909, (Jun. 1996).

Clemen, R., et al., "VT–compensated TTL–Compatible Mos Amplifier", *IBM Technical Disclosure Bulletin, 21*, 2874–2875, (1978).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

DeBar, D.E., "Dynamic Substrate Bias to Achieve Radiation Hardening", *IBM Technical Disclosure Bulletin, 25*, 5829–5830, (1983).

Forbes, L., "Automatic On–clip Threshold Voltage Compensation", *IBM Technical Disclosure Bulletin, 14*, 2894–2895, (1972).

Frantz, H., et al., "Mosfet Substrate Bias–Voltage Generator", *IBM Technical Disclosure Bulletin, 11*, 1219–1220, (Mar. 1969).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Puri, Y., "Substrate Voltage Bounce in NMOS Self–biased Substrates", *IEEE Journal of Solid–State Circuits, SC–13*, 515–519, (Aug. 1978).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Sherony, M.J., et al., "Reduction of Threshold Voltage Sensitivity in SOI MOSFET's" *IEEE Electron Device Letters, 16*, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

Chen, M.J., et al., "Optimizing the Match in Weakly Inverted MOSFET's by Gated Lateral Bipolar Action", *IEEE Transactions on Electron Devices, 43*, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

Denton, J.P., et al., "Fully Depleted Dual–Gated Thin–Film SOI P–MOSFET's Fabricated in SOI Islands with an isolated Buried Polysilicon Backgate", *IEEE Electron Device Letters, 17(11)*, 509–511, (Nov. 1996).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Hisamoto, D., et al., "A New Stacked Cell Structure of Giga–Bit DRAMs using Vertical Ultra–Thin SOI (DELTA) MOSFETs" *1991 IEEE International Electron Devices Meeting, Technical Digest*, Washington, D.C., 959–961, (Dec. 8–11, 1991).

Jung, T.S., et al., "A 117–mm2 3.3–V Only 128–Mb Multilevel NAND Flash Memory for Mass Storage Applications", *IEEE Journal of Solid–State Circuits, 31*, 1575–1583, (Nov. 1996).

Kuge, S., et al., "SOI–DRAM Circuit Technologies for Low Power High Speed Multigiga Scale Memories", *IEEE Journal of Solid–State Circuits, 31(4)*, pp. 586–591, (Apr. 1996).

Suma, K., et al., "An SOI–DRAM with Wide Operating Voltage Range by CMOS–SIMOX Technology", *IEEE Journal of Solid–State Circuits*, 29(11), pp. 1323–1329, (Nov. 1994).

Sun, J., "CMOS Technology for 1.8V and Beyond", *Int'l Symp. on VLSI Technology, Systems, and Applications: Digest of Technical Papers*, 293–297, (1997).

Takato, H., et al., "Impact of Surrounding Gate Transistor (SGT) for Ultra–High Density LSI's", *IEEE Transactions on Electron Devices, 38*, 573–578, (Mar. 1991).

\* cited by examiner

THRESHOLD VOLTAGE COMPENSATION CIRCUITS FOR LOW VOLTAGE AND LOW POWER CMOS INTEGRATED CIRCUITS

This application is a continuation of U.S. application, Ser. No. 09/031,976, filed on Feb. 26, 1998, now U.S. Pat. No. 6,097,242.

TECHNICAL FIELD OF THE INVENTION

The present invention relates generally to integrated circuitry and in particular the present invention relates to compensation circuits for transistor threshold voltages in integrated circuits.

BACKGROUND OF THE INVENTION

Transistors, such as n-channel Field Effect Transistors (FET), formed in a Complementary-Metal-Oxide-Silicon (CMOS) integrated circuit operate when an input voltage is applied to a gate electrode. This gate voltage establishes an electric field perpendicular to a channel between a source and drain of the transistor. A conductance of the channel is controlled by the electric field. If no gate voltage is applied, a path between the source and drain is formed as two back-to-back pn junctions, and a drain current ($I_D$) will be negligible. When a positive voltage is applied to the gate of the transistor, electrons are attracted to the channel. When the gate voltage exceeds a threshold level ($V_t$), an inversion layer is formed in the channel to couple the source and drain. The threshold voltage level of a transistor is dependant upon several variables, both controllable and uncontrollable.

Relatively large threshold voltage variations from 0.4 to 0.6 Volts are common in current CMOS technology. This voltage variation is not compatible with lower power supply voltages implemented as the fabrication technology is scaled down to smaller dimensions. Power supply voltages of around one volt, or less, are required in integrated circuits fabricated with 0.1 micron CMOS technology. The statistical fluctuation of dopant atom concentrations in such submicron fabrication can be significant and contribute to threshold voltage fluctuations.

Different techniques have been described for self-compensation of threshold voltages in nMOS technology by applying a negative substrate bias. One technique, which can be applied in CMOS technology to compensate for $V_t$ fluctuation, includes a capacitor connected to the transistor gate which is charged to correct the threshold voltage variations. This circuit is illustrated in FIG. 1. A current source 10 is coupled to both the drain 12 and gate 14 (through switch 20) of the nMOSFET 16. A reference potential is coupled to the gate through a large capacitor 18 and switch 22. The capacitor is charged to a voltage required to maintain the current from the current source. This capacitor charge is retained while switches 20 and 22 are open and the transistor is connected only to the input signal at node 24. This charge must be refreshed periodically since it can leak away as leakage current in the transistor switches. Threshold voltage variations are thus compensated for by the charge temporarily stored on the capacitor. This technique is practical only for a few critical transistors in an integrated circuit because of the size of the capacitor required for each compensated transistor, such as transistors in a dynamic random access memory device (DRAM) sense amplifier. This capacitor can be implemented in DRAM technology using a stacked storage capacitor.

For the reasons stated above, and for other reasons stated below which will become apparent to those skilled in the art upon reading and understanding the present specification, there is a need in the art for a transistor threshold voltage compensation circuit for low voltage integrated circuits which is not dependant upon the provision of a gate bias capacitor.

SUMMARY OF THE INVENTION

The above mentioned problems with transistor threshold compensation circuits and other problems are addressed by the present invention and which will be understood by reading and studying the following specification. A threshold compensation circuit is described which generates a compensation voltage by regulating a backgate voltage of a transistor.

In particular, the present invention describes a threshold voltage compensation circuit for providing a compensation voltage. The compensation circuit comprises an n-channel transistor having a gate, drain and source fabricated in an isolated p-type well, a current source coupled to the drain and the p-type well, and a voltage supply for coupling the gate to a reference supply. The compensation voltage is provided at the drain for coupling to additional transistors. In an alternate embodiment, the n-channel transistor can be replaced with p-channel transistors.

In another embodiment, an integrated circuit comprises a threshold voltage compensation circuit for providing a compensation voltage. The compensation circuit comprises a first n-channel transistor having a gate, drain and source fabricated in a first isolated p-type well, a current source coupled to the drain and the p-type well, and a voltage supply for coupling the gate to a reference supply. A second n-channel transistor is fabricated in a second isolated p-type well coupled to the first isolated p-type well for receiving the compensation voltage.

An integrated circuit memory device is described which comprises an array of memory cells, control circuitry for controlling operations of the memory device, a threshold voltage compensation circuit for providing a compensation voltage, and a transistor fabricated in an isolated well coupled to receive the compensation voltage. The compensation circuit comprises a first transistor having a gate, drain and source fabricated in a first isolated well, a current source coupled to the drain and the well, and a voltage supply for coupling the gate to a reference supply.

In yet another embodiment a method of compensating for threshold voltage variations in an integrated circuit device is described. The method comprises the steps of coupling a drain and isolation well of a first transistor to a current source, coupling a gate of the first transistor to a reference voltage such that the first transistor is activated and the well is biased to a compensation voltage, and coupling the compensation voltage to a well of a second transistor.

DETAILED DESCRIPTION OF THE INVENTION

Figure 1:
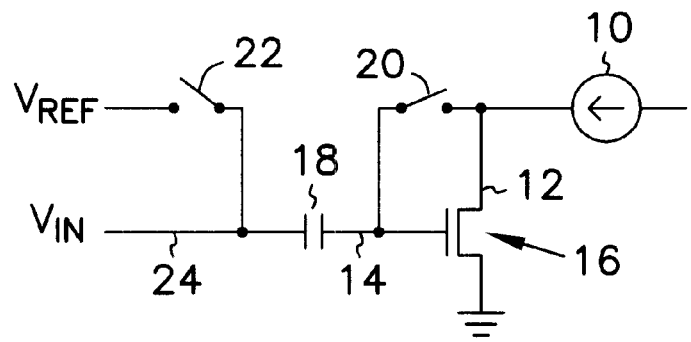
FIG. 1 is a schematic diagram of a prior art transistor threshold compensation circuit using a gate bias capacitor.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
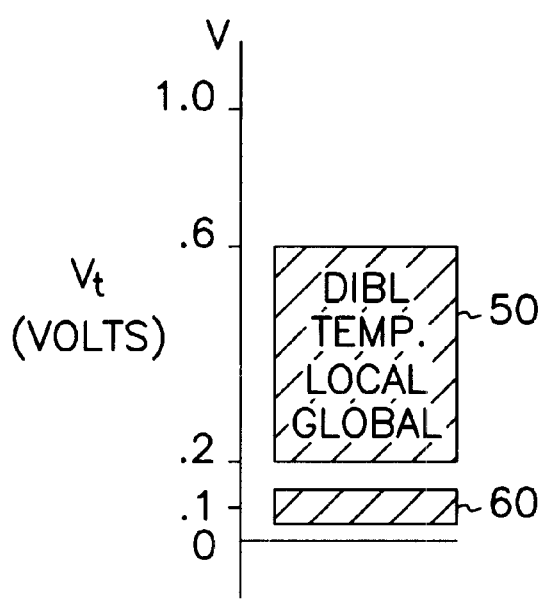
FIG. 2 illustrates a current threshold voltage range, and a desired range.

The present invention describes a circuit for compensation of CMOS threshold voltages when low power supplies such as 1 V, ½ V, or lower are utilized to reduce power dissipation. While the present invention is applicable at any power supply level, it is most useful at power supply levels below three volts. FIG. 2 illustrates variations in threshold voltage which can occur as a consequence of normal process variations and use conditions including local fabrication variations on a wafer, global fabrication variations from wafer lot to wafer lot, differences due to drain-induced barrier lowering (DIBL) and variations due to operating temperature. It is reasonable to expect a 0.4 V variation in threshold voltages. These variations must be accounted for in designs and can result in large variations in circuit speed and even create malfunctions. The desired threshold value (0.1 V) and range of variations (0.1 V) which would be ideal for a 0.5 V power supply CMOS logic technology is also illustrated in FIG. 2.

Figure 3:
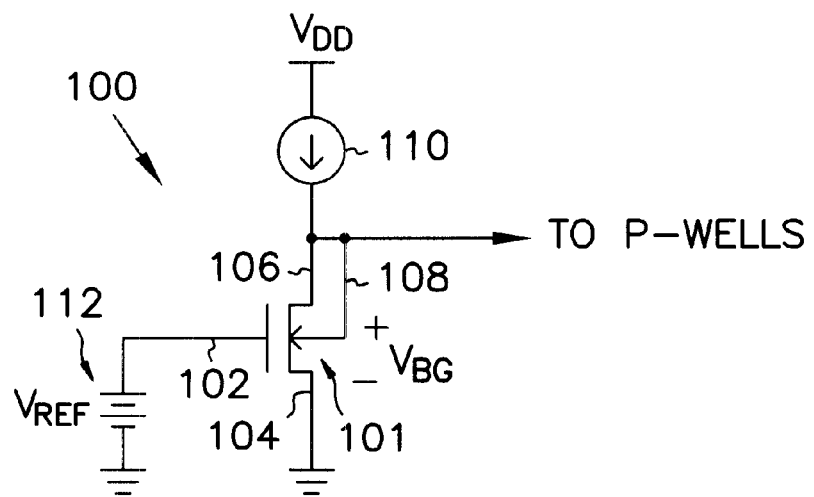
FIG. 3 is a schematic diagram of one transistor threshold compensation circuit of the present invention.
Figure 4:
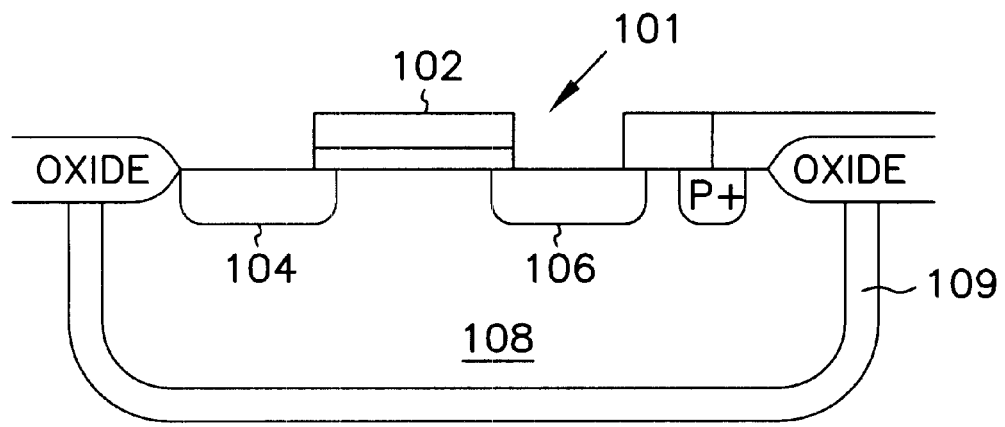
FIG. 4 is a cross-section of an integrated circuit transistor of FIG. 3.

FIG. 3 illustrates one embodiment of a compensation circuit 100 of the present invention. An n-channel transistor 101 is provided which has a gate 102, source 104, and a drain 106. A cross section of the transistor as fabricated in an integrated circuit is illustrated in FIG. 4. The transistor is formed in a p-well 108 which is isolated from the integrated circuit substrate via an n-type isolation region 109. The gate 102 of the transistor is driven at a reference potential, $V_{REF}$, by supply 112. Both the drain 106 and transistor well 108, or backgate, are connected to a current source 110. $V_{REF}$ is some value larger than the threshold voltage, $V_t$, which is desired for optimum circuit functionality and performance. It will be appreciated that different $V_t$ levels may be desired for different circuits on a common integrated circuit die. Any known current source can be used as current source 110.

Figure 5:
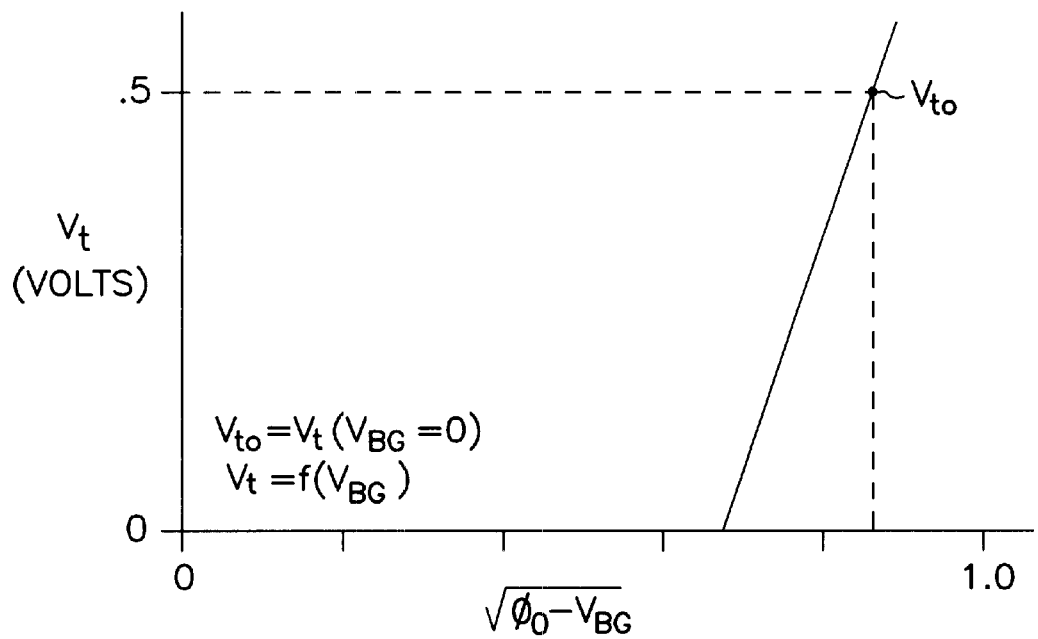
FIG. 5 is a graph illustrating a relationship between a threshold voltage and backgate voltage.
Figure 6:
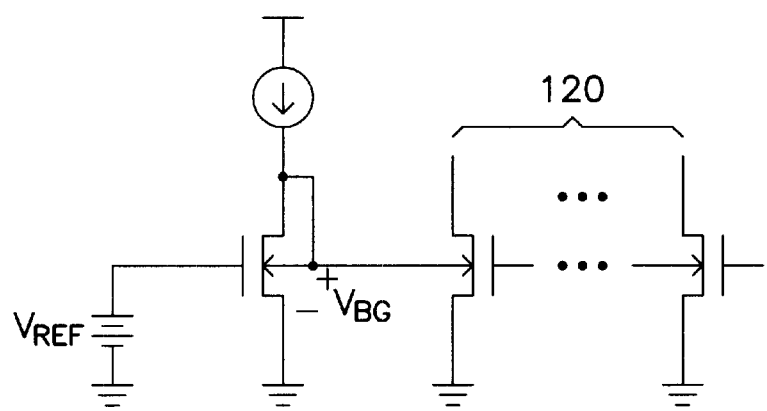
FIG. 6 is a schematic diagram of the transistor threshold compensation circuit of FIG. 3 coupled to transistor provided on the same integrated circuit.

As a consequence of the current source 110 forcing current into the drain, the backgate becomes forward biased and adjusts the backgate bias voltage, $V_{BG}$. The backgate bias voltage is adjusted to a value which provides a threshold voltage value required to support the drain current, $I_D$. The threshold voltage will be less than the reference potential $V_{REF}$ and the transistor will turn on. As shown in FIG. 5, the threshold voltage, $V_t$, decreases as the backgate or substrate becomes forward biased. $V_{t0}$ is the original variable threshold voltage of the transistor with no well bias. The backgate bias voltage, $V_{BG}$, established by the compensation circuit 100 is coupled to a p-well or substrate contact of transistors 120 provided on the integrated circuit which are desired to have a regulated threshold voltage, see FIG. 6.

Figure 7:
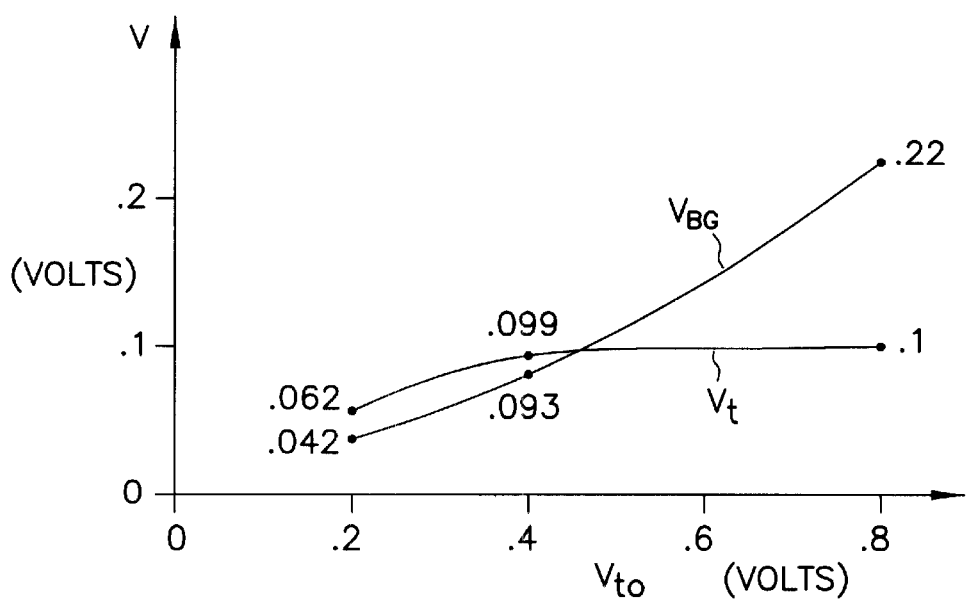
FIG. 7 is a graph of $V_{BG}$ verses $V_t$.

FIG. 7 illustrates the results of a circuit simulation using the commonly available and well-known circuit simulation program SPICE. An original threshold voltage, $V_{t0}$, distribution from 0.2 to 0.8 Volts results in a variation of the backgate voltage from 0.042 to 0.22 Volts. This backgate voltage variation changes the threshold voltage, $V_t$, of the transistor from 0.06 to 0.1 Volts. In other words, the original threshold voltage, $V_{t0}$, variation of 0.6 V=0.8 V−0.2 V was changed to an effective threshold voltage, $V_t$, variation of 0.04 V=0.1 V−0.06 V. Thus, a 600 mV variation was compensated for and reduced to a 40 mV variation. As stated above, the variable backgate voltage, $V_{BG}$, is applied to the p-wells or p-type substrate of other nMOSFET transistors on the same integrated circuit die. In fact, if a CMOS SOI or bulk CMOS p-well technology is used, the wells of different circuitry on the die might be driven with different backgate biases for different applications.

Figure 8:
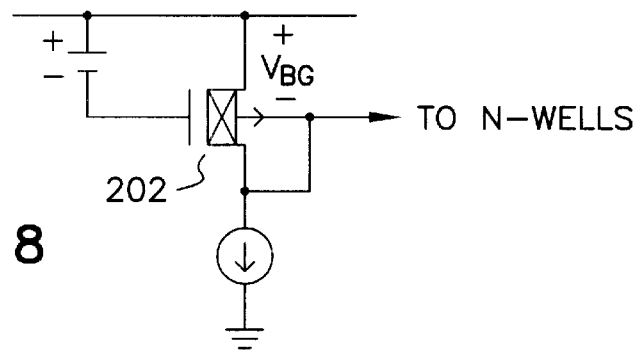
FIG. 8 is a schematic diagram of another transistor threshold compensation circuit of the present invention.

Although the above described circuit uses an n-channel transistor 101, the present invention is not limited to this embodiment. FIG. 8 illustrates another embodiment of a compensation circuit 200 of the present invention using a p-channel transistor 202. This embodiment, provides a variable backgate bias which can be applied to transistor n-wells in a p-type wafer technology, or to a substrate in a n-type wafer technology.

Figure 9:
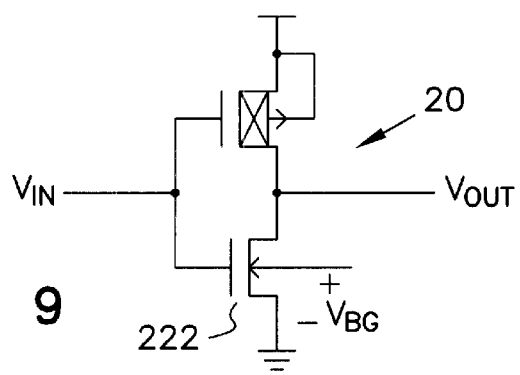
FIG. 9 is a schematic diagram of an inverter circuit having a compensated threshold voltage.

The present invention can be applied to numerous circuits where performance is dependant upon a threshold voltage level. One such circuit is an inverter. FIG. 9 illustrates a CMOS inverter 220 where the backgate bias, or substrate voltage, of an n-channel MOSFET 222 is adjusted to compensate for threshold voltage variations due to fabrication and other variables. The technique is not restricted to inverters but is also applicable to other logic gates and CMOS circuits. For example, the threshold compensation circuits described above can be provided on an integrated circuit memory device.

Figure 10:
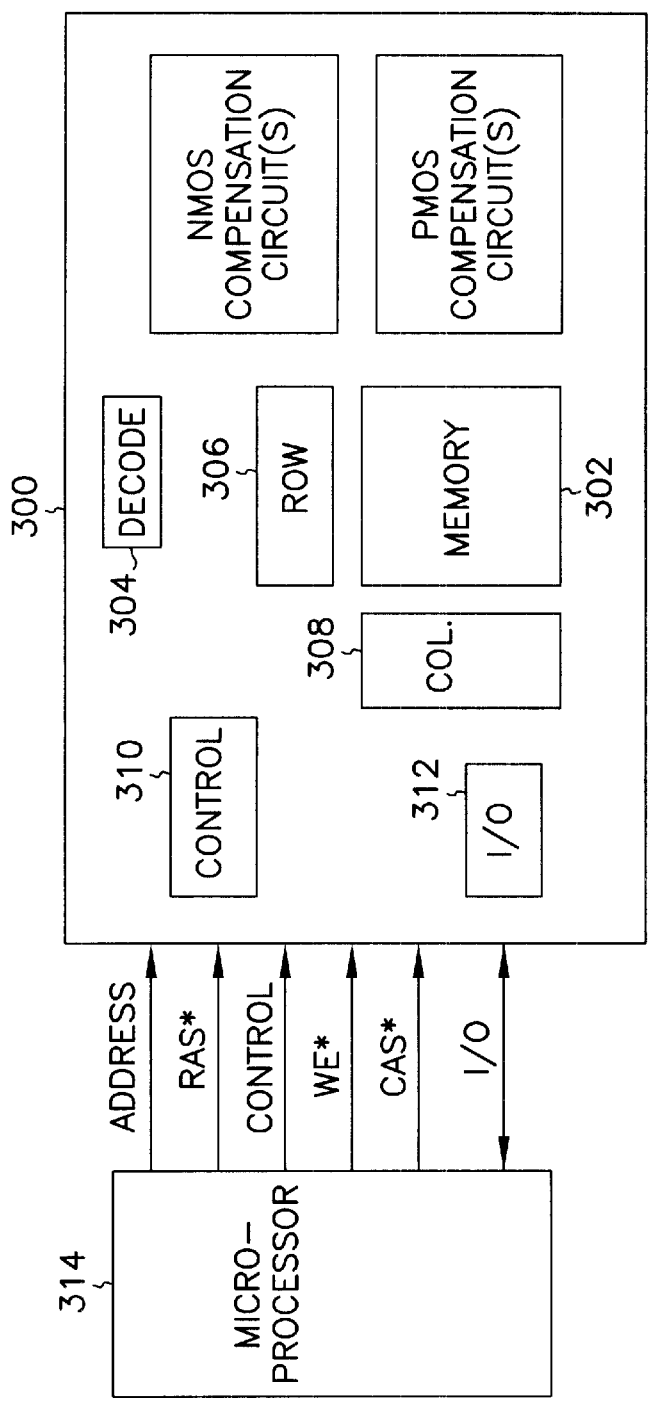
FIG. 10 is a block diagram of a memory device incorporating a transistor threshold compensation circuit.

FIG. 10 is a simplified block diagram of a memory device according to one embodiment of the present invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, write enable, RAS*, row address strobe, and CAS*, column address strobe, signals. The memory is used to store data which is accessed via I/O lines. It will be appreciated by those skilled in the art that additional circuitry and control signals can be provided, and that the memory device of FIG. 10 has been simplified to help focus on the present invention.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Figure 11:
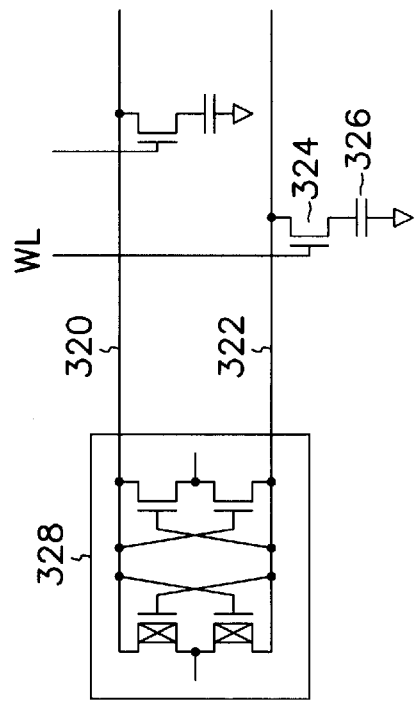
FIG. 11 illustrates a portion of the circuitry of FIG. 10.

Referring to FIG. 11, a portion of the memory device of FIG. 10 is further described. The simplified schematic diagram illustrates a column of the memory array 302. The column is generally defined by a pair of digit lines 320 and 322. Access transistors 324 are located along the digit lines for coupling memory cells 326 to a digit line. The access transistors are activated by a word line (WL), which defines a row of the memory array. A differential amplifier circuit 328 is provided to detect and amplify signals provided on the digit lines. The threshold voltages of the transistors for the sense amplifier circuitry can be controlled, as described herein, to adjust the sensitivity of the sense amplifier. For access transistors 324 in a DRAM memory circuit, a larger $V_t$ value may be desired to reduce memory cell leakage. If a threshold voltage is too low, the word line voltage may need to be driven to a negative level at standby to reduce leakage current and increase retention time in the memory cells.

Conclusion

A compensation circuit for transistor threshold voltages in integrated circuits has been described. The compensation circuit includes a transistor, current source, and gate reference voltage supply. The transistor is biased to provide a well bias voltage, or backgate voltage $V_{BG}$, which can be coupled to transistors provided on an integrated circuit. This compensation circuit eliminates the need for gate biasing capacitors, and provides flexibility in setting threshold voltages in low voltage circuits. The gate reference voltage and current source are established to provide a desired backgate voltage $V_{BG}$. Compensation circuits are described for both n-channel and p-channel transistors. A memory device is described which includes compensation circuits for controlling threshold voltages of transistors provided therein.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A compensation circuit, comprising:
   a transistor having a gate, a source, a drain, and a backgate coupled to the drain;
   a reference voltage supply coupled to the gate; and
   a constant current source coupled to the drain and adapted to force current through the transistor to adjust a backgate bias voltage that provides a threshold voltage required to support a drain current.

2. The compensation circuit of claim 1, wherein:
   the transistor is an NMOS transistor; and
   the constant current source forces current into the drain of the NMOS transistor.

3. The compensation circuit of claim 1, wherein:
   the transistor is a PMOS transistor; and
   the constant current source forces current out of the drain of the PMOS transistor.

4. The compensation circuit of claim 1, wherein the drain of the transistor is coupled to a backgate of at least one target transistor to regulate a threshold voltage of the at least one target transistor.

5. An NMOS compensation circuit, comprising:
   an NMOS transistor having a gate, a source, a drain, and a backgate coupled to the drain;
   a reference voltage supply coupled to the gate; and
   a constant current source coupled to the drain and adapted to force current into the drain of the transistor to adjust a backgate bias voltage that provides a threshold voltage required to support a drain current.

6. The NMOS compensation circuit of claim 5, wherein the drain of the NMOS transistor is coupled to a p-well of at least one NMOS target transistor in n-type wafer technology to regulate a threshold voltage of the at least one NMOS target transistor.

7. The NMOS compensation circuit of claim 5, wherein the drain of the NMOS transistor is coupled to a substrate of at least one NMOS target transistor in p-type wafer technology to regulate a threshold voltage of the at least one NMOS target transistor.

8. A PMOS compensation circuit, comprising:
   a PMOS transistor having a gate, a source, a drain, and a backgate coupled to the drain;
   a reference voltage supply coupled to the gate; and
   a constant current source coupled to the drain and adapted to force current out of the drain of of the transistor to adjust a backgate bias voltage that provides a threshold voltage required to support a drain current.

9. The PMOS compensation circuit of claim 8, wherein the drain of the PMOS transistor is coupled to an n-well of at least one PMOS target transistor in p-type wafer technology to regulate a threshold voltage of the at least one PMOS target transistor.

10. The PMOS compensation circuit of claim 8, wherein the drain of the PMOS transistor is coupled to a substrate of at least one PMOS target transistor in n-type wafer technology to regulate a threshold voltage of the at least one PMOS target transistor.

11. An integrated circuit, comprising:
    at least one target transistor with a backgate; and
    a compensation circuit for regulating a threshold voltage of the at least one target transistor, including:
    a compensation transistor having a gate, a source, a drain coupled to the backgate of the at least one target transistor, and a backgate coupled to the drain of the compensation transistor;
    a reference voltage supply coupled to the gate of the compensation transistor; and
    a constant current source coupled to the drain of the compensation transistor and adapted for forcing current through the compensation transistor to adjust a backgate bias voltage that provides a threshold voltage required to support a drain current.

12. The integrated circuit of claim 11, wherein:
the compensation transistor is an NMOS compensation transistor; and
the constant current source forces current into the drain of the NMOS compensation transistor.

13. The integrated circuit of claim 11, wherein:
the compensation transistor is a PMOS compensation transistor; and
the constant current source forces current out of the drain of the PMOS compensation transistor.

14. An integrated circuit, comprising:
at least one NMOS target transistor with a backgate; and
an NMOS compensation circuit for regulating a threshold voltage of the at least one NMOS target transistor, including:
an NMOS compensation transistor having a gate, a source, a drain coupled to the backgate of the at least one NMOS target transistor, and a backgate coupled to the drain of the NMOS compensation transistor;
a reference voltage supply coupled to the gate of the NMOS compensation transistor; and
a constant current source coupled to the drain of the NMOS compensation transistor and adapted for forcing current into the drain of the NMOS compensation transistor to adjust a backgate bias voltage that provides a threshold voltage required to support a drain current.

15. The integrated circuit of claim 14, wherein the drain of the NMOS compensation transistor is coupled to a p-well of at least one NMOS target transistor in n-type wafer technology to regulate a threshold voltage of the at least one NMOS target transistor.

16. The integrated circuit of claim 14, wherein the drain of the NMOS compensation transistor is coupled to a substrate of at least one NMOS target transistor in p-type wafer technology to regulate a threshold voltage of the at least one NMOS target transistor.

17. An integrated circuit, comprising:
at least one PMOS target transistor with a backgate; and
a PMOS compensation circuit for regulating a threshold voltage of the at least one PMOS target transistor, including:
an PMOS compensation transistor having a gate, a source, a drain coupled to the backgate of the at least one PMOS target transistor, and a backgate coupled to the drain of the PMOS compensation transistor;
a reference voltage supply coupled to the gate of the PMOS compensation transistor; and
a constant current source coupled to the drain of the PMOS compensation transistor and adapted for forcing current out of the drain of the PMOS compensation transistor to adjust a backgate bias voltage that provides a threshold voltage required to support a drain current.

18. The integrated circuit of claim 17, wherein the drain of the PMOS compensation transistor is coupled to an n-well of at least one PMOS target transistor in p-type wafer technology to regulate a threshold voltage of the at least one PMOS target transistor.

19. The integrated circuit of claim 17, wherein the drain of the PMOS compensation transistor is coupled to a substrate of at least one PMOS target transistor in n-type wafer technology to regulate a threshold voltage of the at least one PMOS target transistor.

20. A CMOS integrated circuit, comprising:
at least one NMOS target transistor with a backgate;
at least one PMOS target transistor with a backgate, wherein the at least one PMOS target transistor is electrically connected to the at least one NMOS target transistor;
at least one NMOS compensation circuit for regulating a threshold voltage of the at least one NMOS target transistor, each NMOS compensation circuit including:
an NMOS compensation transistor having a gate, a source, a drain coupled to the backgate of the at least one NMOS target transistor, and a backgate coupled to the drain of the NMOS compensation transistor;
a reference voltage supply coupled to the gate of the NMOS compensation transistor; and
a constant current source coupled to the drain of the NMOS compensation transistor and adapted for forcing current into the drain of the NMOS compensation transistor to adjust a backgate bias voltage that provides a threshold voltage required to support an NMOS drain current; and
at least one PMOS compensation circuit for regulating a threshold voltage of the at least one PMOS target transistor, each PMOS compensation circuit including:
a PMOS compensation transistor having a gate, a source, a drain coupled to the backgate of the at least one PMOS target transistor, and a backgate coupled to the drain of the PMOS compensation transistor;
a reference voltage supply coupled to the gate of the PMOS compensation transistor; and
a constant current source coupled to the drain of the PMOS compensation transistor and adapted for forcing current out of the drain of the PMOS compensation transistor to adjust a backgate bias voltage that provides a threshold voltage required to support a PMOS drain current.

21. An integrated circuit inverter with a compensated threshold voltage, comprising:
a PMOS transistor with a PMOS gate, a PMOS drain, a PMOS source and a PMOS backgate coupled to the PMOS drain;
an NMOS target transistor with an NMOS gate, an NMOS drain, an NMOS source coupled to the PMOS source, and an NMOS backgate;
an input node coupled to the PMOS gate and to the NMOS gate;
an output node coupled to the PMOS source and the NMOS source; and
a compensation circuit coupled to the NMOS backgate to provide a backgate bias voltage that adjusts an NMOS threshold voltage, the compensation circuit including:
an NMOS compensation transistor having a gate, a source, a drain, and a backgate coupled to the drain;
a reference voltage supply coupled to the gate of the NMOS compensation transistor; and
a constant current source coupled to and adapted to force current into the drain of the NMOS compensation transistor to adjust a backgate bias voltage that provides a threshold voltage required to support a drain current.

22. The integrated circuit inverter of claim 21, wherein the drain of the NMOS transistor is coupled to a p-well of at least one NMOS target transistor in n-type wafer technology to regulate a threshold voltage of the at least one NMOS target transistor.

23. The integrated circuit inverter of claim 21, wherein the drain of the NMOS transistor is coupled to a substrate of the NMOS target transistor in p-type wafer technology to regulate a threshold voltage of the NMOS target transistor.

24. A method of compensating for threshold voltage variations in an integrated circuit device, comprising:

forcing current through a compensation transistor using a constant current source to adjust a backgate bias voltage that provides a threshold voltage required to support a drain current; and applying a drain voltage from the compensation transistor to a backgate of at least one target transistor to regulate a threshold voltage of the at least one target transistor.

25. The method of claim 24, wherein forcing current through a compensation transistor using a constant current source includes forcing current into a drain of an NMOS transistor.

26. The method of claim 24, wherein forcing current through a compensation transistor using a constant current source includes forcing current out of a drain of a PMOS transistor.

27. A method of forming a threshold voltage compensation circuit, comprising:

providing a compensation transistor with a gate, a source, a drain and a backgate;

providing a voltage reference;

coupling the voltage reference to the gate of the compensation transistor;

coupling the backgate of the compensation transistor to the drain of the compensation transistor; and providing a voltage threshold compensation output at a node coupled to the drain of the compensation transistor.

28. A method of forming an integrated circuit with a compensated threshold voltage, comprising:

providing a compensation transistor with a gate, a source, a drain and a backgate;

providing a voltage reference;

coupling the voltage reference to the gate of the compensation transistor;

coupling the backgate of the compensation transistor to the drain of the compensation transistor;

providing at least one target transistor with a backgate; and coupling the drain of the compensation transistor to the backgate of the at least one target transistor.

* * * * *

UNITED STATES PATENT AND TRADEMARK OFFICE
CERTIFICATE OF CORRECTION

PATENT NO.    : 6,456,157 B1                                                                     Page 1 of 1
DATED         : September 24, 2002
INVENTOR(S)   : Leonard Forbes and Kie Y. Ahn It is certified that error appears in the above-identified patent and that said Letters Patent is hereby corrected as shown below:

<u>Title page,</u>
Item [57], "ABSTRACT",
Line 10, delete ":" after "source".

Item [56], OTHER PUBLICATIONS, delete "of" and insert -- for --, therefor.

<u>Column 6,</u>
Line 40, delete "of" after "drain".

Signed and Sealed this

Eighteenth Day of February, 2003

JAMES E. ROGAN
*Director of the United States Patent and Trademark Office*